(12) United States Patent
Lee et al.

(10) Patent No.: US 12,321,096 B2
(45) Date of Patent: Jun. 3, 2025

(54) CURABLE RESIN COMPOSITION, CURED FILM FORMED THEREFROM, AND ELECTRONIC DEVICE HAVING CURED FILM

(71) Applicant: SAMSUNG SDI CO., LTD., Yongin-si (KR)

(72) Inventors: Seungeun Lee, Suwon-si (KR); Dongju Shin, Suwon-si (KR); Ji Yoon Kim, Suwon-si (KR); Jeehyun Ryu, Suwon-si (KR); Minji So, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 582 days.

(21) Appl. No.: 17/597,087

(22) PCT Filed: Aug. 28, 2020

(86) PCT No.: PCT/KR2020/011554
§ 371 (c)(1),
(2) Date: Dec. 23, 2021

(87) PCT Pub. No.: WO2021/045453
PCT Pub. Date: Mar. 11, 2021

(65) Prior Publication Data
US 2022/0260911 A1    Aug. 18, 2022

(30) Foreign Application Priority Data

Sep. 4, 2019 (KR) .................. 10-2019-0109738
Jun. 15, 2020 (KR) .................. 10-2020-0072231

(51) Int. Cl.
*G03F 7/075* (2006.01)
*B82Y 40/00* (2011.01)
*G03F 7/004* (2006.01)

(52) U.S. Cl.
CPC .......... *G03F 7/0755* (2013.01); *G03F 7/0045* (2013.01); *B82Y 40/00* (2013.01)

(58) Field of Classification Search
None
See application file for complete search history.

(56) References Cited

U.S. PATENT DOCUMENTS

| | | | |
|---|---|---|---|
| 8,367,190 B2* | 2/2013 | Son ................. | C09D 183/04 522/63 |
| 8,968,458 B2* | 3/2015 | Konno .............. | G03F 7/0751 106/287.12 |
| 9,102,836 B2* | 8/2015 | Lin .................. | C09D 7/61 |
| 2009/0050020 A1* | 2/2009 | Konno .............. | G03F 7/0752 106/287.12 |
| 2010/0080973 A1 | 4/2010 | Son et al. | |
| 2013/0344338 A1* | 12/2013 | Bekiarian ......... | B82Y 40/00 556/425 |
| 2015/0301231 A1* | 10/2015 | Yang ................ | G02B 1/14 428/313.9 |
| 2016/0108250 A1 | 4/2016 | Tamura et al. | |

FOREIGN PATENT DOCUMENTS

| | | |
|---|---|---|
| CN | 1969023 A | 5/2007 |
| CN | 101133364 A | 2/2008 |
| CN | 101517001 A | 8/2009 |
| CN | 104813198 A | 7/2015 |
| CN | 105263967 A | 1/2016 |
| EP | 2987809 A1 | 2/2016 |
| JP | 2005-154723 A | 6/2005 |
| JP | 2010-503761 A | 2/2010 |
| JP | 2010-144136 A | 7/2010 |
| JP | 2011-63663 A | 3/2011 |
| JP | 2011-241351 A | 12/2011 |
| JP | 2012-52110 A | 3/2012 |
| JP | 2013-7929 A | 1/2013 |
| JP | 2013-127065 A | 6/2013 |
| JP | 2013-189579 A | 9/2013 |
| JP | 2015-140389 A | 8/2015 |
| JP | 2017-39928 A | 2/2017 |
| KR | 10-0882794 B1 | 2/2009 |
| KR | 10-0890126 B1 | 3/2009 |
| KR | 10-2009-0043397 A | 5/2009 |
| KR | 10-2009-0060403 A | 6/2009 |
| KR | 10-0955570 B1 | 4/2010 |
| KR | 10-2011-0039862 A | 4/2011 |
| KR | 10-1141955 B1 | 5/2012 |
| KR | 10-2014-0065250 A | 5/2014 |
| KR | 10-1393901 B1 | 5/2014 |
| KR | 10-2015-0143573 A | 12/2015 |
| KR | 10-2016-0076040 A | 6/2016 |
| KR | 10-2016-0101333 A | 8/2016 |
| TW | 2010-12882 A1 | 4/2010 |

(Continued)

OTHER PUBLICATIONS

International Search Report of corresponding PCT/KR2020/011554, Dec. 2, 2020, 6 pp.
Chinese Office Action dated Oct. 10, 2022, issued in corresponding Chinese Patent Application No. 202080047581.8 (7 pages).
Japanese Office Action dated Nov. 15, 2022, issued in corresponding Japanese Patent Application No. 2021-568797 (4 pages).
"Rubber and plastic shoemaking materials and applications," Feb. 1999, with Translation of excerpt, 4 pages.

(Continued)

*Primary Examiner* — Sean M DeGuire
*Assistant Examiner* — Andrew Preston Traywick
(74) *Attorney, Agent, or Firm* — Womble Bond Dickinson (US) LLP

(57) ABSTRACT

A curable resin composition comprising (A) a silicone-based polymer, the surface, and (C) a solvent.

20 Claims, No Drawings

(56) References Cited

FOREIGN PATENT DOCUMENTS

WO     2006/093057 A1    9/2006
WO     2017/170275 A1    10/2017

OTHER PUBLICATIONS

Chinese Search Report dated Apr. 7, 2023, issued in corresponding Chinese Patent Application No. 202080047581.8 (2 pages).

* cited by examiner

CURABLE RESIN COMPOSITION, CURED FILM FORMED THEREFROM, AND ELECTRONIC DEVICE HAVING CURED FILM

CROSS-REFERENCE TO RELATED APPLICATION(S)

This application is a U.S. National Phase Patent Application of International Application Number PCT/KR2020/011554, filed on Aug. 28, 2020, which claims priority of Korean Patent Application Number 10-2019-0109738, filed on Sep. 4, 2019, and Korean Patent Application Number 10-2020-0072231, filed on Jun. 15, 2020, the entire content of each of which is incorporated herein by reference.

TECHNICAL FIELD

This disclosure relates to a curable resin composition, a cured film prepared from the curable resin composition, and an electronic device incorporating the cured film.

BACKGROUND ART

With a development of a display field, various display devices using a display are diversified, and a technique for applying a low refractive material to a device using light among various display devices has been increasing. By using low refractive characteristics, efficiency may be improved by reducing light loss inside a device in which light moves. In addition, the low refractive characteristics may be used for a low-reflection layer of lens outside the light sensor, or an anti-reflection coating (AR) on the outermost side of a display or a solar cell, due to the low-reflectance effect. As the refractive index of a low refractive coating layer is lower, a thickness of the coating layer becomes smaller, thereby increasing a margin of the coating layer and increasing efficiency according to the purpose of the device.

When a low refractive silicone material is used between the layers of the panel and light moves inside, an amount of lost light may be recycled to improve luminous efficiency. In particular, since it is difficult to increase luminous efficiency of the green QD emitter among QD PR (quantum dot photoreflectance), a low refractive coating layer may be may be introduced on upper and lower layers of the QD to increase luminous efficiency of the green QD emitter.

On the other hand, when a lower substrate has patterns, high step differences may occur between the patterns, and when a low refractive layer is coated thereon, a chemical liquid may flow between the patterns and the low refractive layer may be thickly accumulated. Therefore, the low refractive layer should have crack resistance that does not crack at high thickness, and at the same time, must maintain high transparency.

In a conventional process of forming the low refractive layer as described above, a fluorine-based compound is included in a form of a polymer to prevent cracking, but in this case, it is difficult to implement a satisfactory low refractive index since it accompanies an increase in the refractive index.

DISCLOSURE

Technical Problem

An embodiment provides a curable resin composition having improved crack resistance and transparency and a low refractive index and low reflectance.

Another embodiment provides a cured film prepared using the curable resin composition.

Another embodiment provides an electronic device including the cured film.

Technical Solution

An embodiment provides a curable resin composition that includes (A) a silicone-based polymer, (B) particles including a compound having the N-aryl amino group on the surface, and (C) a solvent.

The silicone-based polymer may be a siloxane polymer formed by hydrolyzing and condensing a compound represented by Chemical Formula 1.

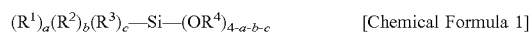

$(R^1)_a(R^2)_b(R^3)_c$—Si—$(OR^4)_{4-a-b-c}$     [Chemical Formula 1]

In Chemical Formula 1, $R^1$ to $R^3$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, R(C=O)— (wherein, R is a substituted or unsubstituted C1 to C30 alkyl group, a substituted or unsubstituted C3 to C30 cycloalkyl group, or a substituted or unsubstituted C6 to C30 aryl group), an epoxy group, a (meth)acrylate group, a (meth)acryloyloxy group, or a combination thereof, $R^4$ is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, or a combination thereof, and $0 \leq a+b+c < 4$.

The siloxane polymer may be formed by hydrolyzing and condensing the compound represented by Chemical Formula 1 and a compound represented by Chemical Formula 2.

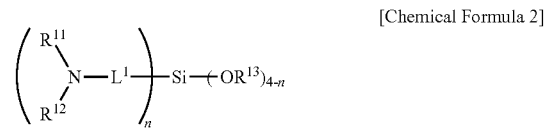

[Chemical Formula 2]

In Chemical Formula 2, $L^1$ is a single bond, a substituted or unsubstituted C1 to C10 alkylene group, a substituted or unsubstituted C3 to C10 cycloalkylene group, a substituted or unsubstituted C6 to C30 arylene group, or a combination thereof, $R^{11}$ and $R^{12}$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, or a combination thereof, provided that at least one of $R^{11}$ and $R^{12}$ is a substituted or unsubstituted C6 to C30 aryl group, $R^{13}$ is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, or a combination thereof, and $0 < n < 4$.

The siloxane polymer may be formed by hydrolysis and condensation reactions, including 50 to 85 mol % of the compound represented by Chemical Formula 1 and 15 to 50 mol % of the compound represented by Chemical Formula 2.

The siloxane polymer may be formed by hydrolysis and condensation reactions, further including a compound represented by Chemical Formula 3.

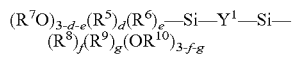   [Chemical Formula 3]

In Chemical Formula 3, $R^5$, $R^6$, $R^8$, and $R^9$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, R(C=O)— (wherein R is a substituted or unsubstituted C1 to C30 alkyl group, a substituted or unsubstituted C3 to C30 cycloalkyl group, or a substituted or unsubstituted C6 to C30 aryl group), an epoxy group, a (meth)acrylate group, a C1 to C30 alkyl group substituted with a (meth)acrylate group, a (meth)acryloyloxy group, or a combination thereof, $R^7$ and $R^{10}$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, or a combination thereof, $Y^1$ is a substituted or unsubstituted C1 to C30 alkylene group, a substituted or unsubstituted C3 to C30 cycloalkylene group, a substituted or unsubstituted C6 to C30 arylene group, or a combination thereof, wherein the substituted or unsubstituted C6 to C30 arylene group is composed of a single aromatic ring, or includes 2 or more aromatic rings that are linked to each other by a single bond, —O—, —S—, —CO—, —COO—, —CONH—, a substituted or unsubstituted C1 to C30 alkylene group, a substituted or unsubstituted C3 to C30 cycloalkylene group, or a combination thereof, $0 \leq d+e < 3$, and $0 \leq f+g < 3$.

The siloxane polymer may be formed by hydrolysis and condensation reaction, including 5 mol % to 30 mol % of the compound represented by Chemical Formula 3 based on 100 mol % of the siloxane polymer.

The silicone-based polymer may have a weight average molecular weight, reduced to polystyrene, of 1,000 to 50,000 g/mol.

The compound having the N-aryl amino group included on the surface of the particles may be the compound represented by Chemical Formula 2.

At least one of $R^{11}$ and $R^{12}$ in Chemical Formula 2 may be a phenyl group.

In Chemical Formula 2, $L^1$ may be a substituted or unsubstituted C1 to C5 alkylene group, and one of $R^{11}$ and $R^{12}$ may be a phenyl group, the other may be hydrogen, $R^{13}$ may be a substituted or unsubstituted C1 internal C5 alkyl group, and n may be 1.

The particles may have a hollow structure.

The particles may be particulates of a metal oxide including titanium oxide, silicon oxide, barium oxide, zinc oxide, zirconium oxide, or a combination thereof.

The particles may be hollow silica ($SiO_2$).

The particles may have an average diameter ($D_{50}$) of 10 nm to 150 nm.

The compound having the N-aryl amino group on the surface may be included in an amount of 1 to 10 parts by weight per 100 parts by weight of the particles.

The curable resin composition may include 1 part by weight to 100 parts by weight of (B) the particles including the compound having the N-aryl amino group on the surface and 100 parts by weight to 2,000 parts by weight of (C) the solvent, based on 100 parts by weight of (A) the silicone-based polymer.

Another embodiment provides a cured film obtained by curing the curable resin composition.

Another embodiment provides a device including the cured film.

[Advantageous Effects]

The cured film prepared by using the curable resin composition according to an embodiment has excellent crack resistance and, simultaneously, has high transparency and low refractive characteristics, and thus may be advantageously used for applications such as an anti-reflection film or a low refractive layer.

[Best Mode]

Hereinafter, embodiments of the present invention are described in detail. However, these embodiments are exemplary, the present invention is not limited thereto and the present invention is defined by the scope of claims.

In the present specification, when specific definition is not otherwise provided, "alkyl group" refers to a C1 to C30 alkyl group, "cycloalkyl group" refers to a C3 to C30 cycloalkyl group, "aryl group" refers to a C6 to C30 aryl group, "arylalkyl group" refers to a C7 to C30 arylalkyl group, "heteroalkyl group" refers to a C1 to C30 heteroalkyl group, the term "heterocycloalkyl group" refers to a C2 to C30 heterocycloalkyl group, "alkenyl group" refers to a C2 to C30 alkenyl group, "alkynyl group" refers to a C2 to C30 alkynyl group, "alkylene group" refers to a C1 to C30 alkylene group, "cycloalkylene group" refers to a C3 to C30 cycloalkylene group, and "arylene group" refers to a C6 to C30 arylene group.

In the present specification, when specific definition is not otherwise provided, "substituted" refers to replacement of at least one hydrogen by a substituent of a halogen atom (F, Cl, Br, or I), a hydroxy group, a C1 to C20 alkoxy group, a nitro group, a cyano group, an amine group, an amino group, an amino group substituted with an alkyl group, an amino group substituted with an aryl group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof.

In the present specification, when specific definition is not otherwise provided, "hetero" may refer to one substituted with at least one heteroatom of N, O, S and P, in a chemical formula.

In the present specification, when specific definition is not otherwise provided, "(meth)acrylate" refers to both "acrylate" and "methacrylate", and "(meth)acrylic acid" refers to "acrylic acid" and "methacrylic acid".

In the present specification, when specific definition is not otherwise provided, the term "combination" refers to mixing or copolymerization.

In the present specification, unless a specific definition is otherwise provided, a hydrogen atom is boned at the position when a chemical bond is not present where supposed to be given.

As used herein, when specific definition is not otherwise provided, "*" indicates a point where the same or different atom or chemical formula is linked.

Hereinafter, a curable resin composition according to an embodiment is described.

The curable resin composition according to an embodiment of the present invention includes (A) a silicone-based polymer and (B) particles including a compound having an N-aryl amino group on the surface, and (C) a solvent.

A color filter layer may be present under the low refractive layer inside the QD-OLED panel. In the color filter layer, the substrate is not flat and step differences are generated due to a pattern. Accordingly, there is a problem in that cracks are generated when a conventional composition having low refractive characteristics is coated and cured on the substrate under the influence of step differences generated under the low refractive layer.

In order to solve the above problems, an attempt is made to include an epoxy-based or fluorine-based compound in a curable resin composition forming a low refractive layer, but in this case, it is difficult to implement low refractive characteristics of less than or equal to 1.23, and even if a low refractive characteristics of 1.26 level is ensured, there are still problems that cracks are frequently formed on the entire surface when a thickness of the cured film is greater than or equal to 2 μm.

In addition, in the case of a conventional silicon-based material having refractive index characteristics of less than or equal to 1.23, there are problems that the transparency of the coating film is deteriorated when the thickness of the cured film is greater than or equal to 2 μm, and there are problems of cracking when the thickness of the cured film is greater than or equal to 2.5 μm.

The curable resin composition according to an embodiment includes particles including the compound having the N-aryl amino group on the surface, and thus not only has low refractive index characteristics, but also has crack resistance that cracks are not generated in the cured film even when there is step differences of greater than or equal to 4 μm, and may also implement a coating film having excellent transparency even when a coating film of greater than or equal to 2 μm is formed.

Specifically, the cured film obtained by curing the curable resin composition has a crack resistance at a process temperature of 230° C. up to a thickness of 7 μm. In addition, a haze value at a wavelength of 650 nm shows a property of less than or equal to 0.5%, and thus has high transparency, and a refractive index at a wavelength of 500 nm to 550 nm may be reduced to less than or equal to 1.23, for example, up to the range of 1.18.

The (A) silicone-based polymer may be a siloxane polymer formed by hydrolyzing and condensing a compound represented by Chemical Formula 1.

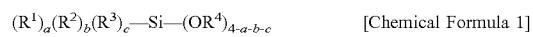   [Chemical Formula 1]

In Chemical Formula 1, $R^1$ to $R^3$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, R(C=O)— (wherein, R is a substituted or unsubstituted C1 to C30 alkyl group, a substituted or unsubstituted C3 to C30 cycloalkyl group, or a substituted or unsubstituted C6 to C30 aryl group), an epoxy group, a (meth)acrylate group, a (meth)acryloyloxy group, or a combination thereof, $R^4$ is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, or a combination thereof, and

The siloxane polymer may be formed by hydrolyzing and condensing the compound represented by Chemical Formula 1 and a compound represented by Chemical Formula 2.

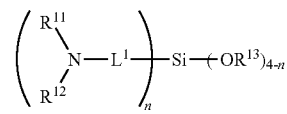   [Chemical Formula 2]

In Chemical Formula 2, $L^1$ is a single bond, a substituted or unsubstituted C1 to C10 alkylene group, a substituted or unsubstituted C3 to C10 cycloalkylene group, a substituted or unsubstituted C6 to C30 arylene group, or a combination thereof, $R^{11}$ and $R^{12}$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, or a combination thereof, provided that at least one of $R^{11}$ and $R^{12}$ is a substituted or unsubstituted C6 to C30 aryl group, R¹³ is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, or a combination thereof, and $0<n<4$.

When the siloxane polymer is formed by hydrolyzing and condensing the compound represented by Chemical Formula 1 and a compound represented by Chemical Formula 2, the siloxane polymer also includes an N-aryl amino group as a substituent in the polymer, in this case, crack resistance and high transparency (low haze) properties of the curable resin composition according to an embodiment may be further improved.

The improved crack resistance of the curable resin composition may be expected to be caused by heat resistance of the composition as it includes a siloxane polymer including a phenyl group in the composition, and by flexibility of the composition as the siloxane polymer includes an alkylene group.

In addition, when the siloxane polymer is formed by hydrolysis and condensation reaction including the compound represented by Chemical Formula 2, since the polymer includes an N-aryl amino group, like the particles including the compound having the N-aryl amino group on the surface, compatibility with the particles is increased, and as a result, transparency properties of the cured film prepared using the curable resin composition are improved.

The siloxane polymer may be formed by hydrolysis and condensation reactions, including 50 to 85 mol % of the compound represented by Chemical Formula 1 and 15 to 50 mol % of the compound represented by Chemical Formula 2, for example, 55 to 80 mol % of the compound represented by Chemical Formula 1 and 20 to 45 mol % of the compound represented by Chemical Formula 2, for example, 65 to 75 mol % of the compound represented by Chemical Formula 1 and 25 to 35 mol % of the compound represented by Chemical Formula 2. When they are included within the above ranges, crack resistance and transparent properties of the curable resin composition prepared therefrom may be further improved.

The siloxane polymer may further be formed by hydrolysis and condensation reaction by further including a compound represented by Chemical Formula 3 together with the compounds represented by Chemical Formula 1 and Chemical Formula 2.

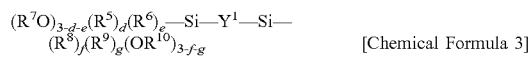

[Chemical Formula 3]

In Chemical Formula 3, $R^5$, $R^6$, $R^8$, and $R^9$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, R(C=O)— (wherein R is a substituted or unsubstituted C1 to C30 alkyl group, a substituted or unsubstituted C3 to C30 cycloalkyl group, or a substituted or unsubstituted C6 to C30 aryl group), an epoxy group, a (meth)acrylate group, a C1 to C30 alkyl group substituted with a (meth)acrylate group, a (meth)acryloyloxy group, or a combination thereof, $R^7$ and $R^{10}$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, or a combination thereof, $Y^1$ is a substituted or unsubstituted C1 to C30 alkylene group, a substituted or unsubstituted C3 to C30 cycloalkylene group, a substituted or unsubstituted C6 to C30 arylene group, or a combination thereof, wherein the substituted or unsubstituted C6 to C30 arylene group is composed of a single aromatic ring, or includes 2 or more aromatic rings that are linked to each other by a single bond, —O—, —S—, —CO—, —COO—, —CONH—, a substituted or unsubstituted C1 to C30 alkylene group, a substituted or unsubstituted C3 to C30 cycloalkylene group, or a combination thereof, $0 \leq d+e < 3$, and $0 \leq f+g < 3$.

The siloxane polymer may be formed by hydrolysis and condensation reaction, including the compound represented by Chemical Formula 3 in an amount of 5 mol % to 30 mol %, for example, 5 mol % to 25 mol %, for example, 5 mol % to 20 mol %, for example, 5 mol % to 15 mol %, for example, 5 mol % to 10 mol %, for example, 10 mol % to 30 mol %, for example, 15 mol % to 30 mol %, for example, 25 mol % to 30 mol % based on 100 mol % of the siloxane polymer, but is not limited thereto.

The siloxane polymer may have a weight average molecular weight, reduced to polystyrene, of 1,000 to 50,000 g/mol, for example, 2,000 to 50,000 g/mol, for example, 3,000 to 50,000 g/mol, for example, 5,000 to 50,000 g/mol, for example, 7,000 to 50,000 g/mol, for example, 9,000 to 50,000 g/mol, for example, 10,000 to 50,000 g/mol, for example, 15,000 to 50,000 g/mol, for example, 20,000 to 50,000 g/mol, for example, 25,000 to 50,000 g/mol, for example, 1,000 to 45,000 g/mol, for example, 1,000 to 40,000 g/mol, for example, 1,000 to 35,000 g/mol, for example, 1,000 to 30,000 g/mol, for example, 1,000 to 25,000 g/mol, but is not limited thereto.

In (B) the particles including the compound having the N-aryl amino group on the surface, the compound having the N-aryl amino group may be the compound represented by Chemical Formula 2.

in an embodiment, in the compound represented by Chemical Formula 2 that forms the siloxane polymer or included on the surface of the particles, at least one of $R^{11}$ and $R^{12}$ in Chemical Formula 2 may be a phenyl group.

For example, in Chemical Formula 2, $L^1$ may be a substituted or unsubstituted C1 to C5 alkylene group, one of $R^{11}$ and $R^{12}$ may be a phenyl group and the other may be hydrogen, $R^{13}$ may be a substituted or unsubstituted C1 to C5 alkyl group, and n may be 1.

The compound represented by Chemical Formula 2 may be, for example, N-phenylaminopropyltrimethoxysilane, N-phenylaminopropyltriethoxysilane, N-phenylam inoethyltrimethoxysilane, N-phenylaminoethyltriethoxysilane, N, N-diphenylam inopropyltrimethoxysilane, N, N-diphenylam inopropyltriethoxysilane, 3-(N-cyclohexylamino)propyltrimethoxysilane, 3-(N-cyclohexylamino)propyltriethoxysilane, methoxy-(N-phenyl-2-aminoethoxy)dimethylsilane, N-(triethoxysilylmethyl)aniline, N-[[diethoxy(methyl)silyl]methyl]aniline, 4-N-(1-triethoxysilylpropyl)benzene-1,4-diamine, N-(1-trimethoxysilylpropyl)aniline, N-(1-triethoxysilylpropyl)aniline, N-[3-[dimethoxy(methyl)silyl]-2-methylpropyl]aniline, 4-anilinobutyl(diethoxy)silicon, N-(2-trimethoxysilylethyl)aniline, N-(3-tributoxysilylpropyl)aniline, N-(3-tripropoxysilylpropyl)aniline, N'-phenyl-N-(3-triethoxysilylpropyl)ethane-1,2-diamine, N-(4-trimethoxysilylbutyl)aniline, or N-(5-trimethoxysilylpentyl)aniline.

The particles may have a hollow structure.

For example, the particles may be particulates of a metal oxide including titanium oxide, silicon oxide, barium oxide, zinc oxide, zirconium oxide, or a combination thereof, but are not limited thereto.

For example, the particles may be hollow silica ($SiO_2$), but is not necessarily limited thereto.

The particles may have an average diameter ($D_{50}$) of 10 nm to 150 nm, for example, 10 nm to 130 nm, for example, 10 nm to 110 nm, for example, 20 nm to 110 nm, for example, 40 nm to 110 nm, for example, 60 nm to 110 nm, but are not limited thereto. When the average diameter sizes of the particles satisfy the above ranges, the particles may be well dispersed in the siloxane polymer, and the low refractive index characteristics of the curable resin composition may be improved.

When the particles have a hollow structure, the porosity may be 40% to 90%, for example, 40% to 80%, for example, 40% to 70%, for example 40% to 60%, for example, 40% to 50%, for example, 50% to 90%, for example 60% to 90%, for example, 70% to 90%, for example, 80% to 90%, for example, 50% to 70%, but are not limited thereto. When the porosity of the particles exceeds the above range, the size of the inner space of the particles increases and the outer thickness decreases, so that durability of the particles may decrease and an refractive index decrease effect of the low refractive layer may be minimal.

The compound having the N-aryl amino group on the surface may be included in an amount of 1 to 10 parts by weight, for example, 1 to 9.5 parts by weight, for example, 1 to 8 parts by weight, for example, 1 to 8.5 parts by weight, for example, 1 to 8 parts by weight, for example, 1 to 7.5 parts by weight, for example, 1 to 7 parts by weight, for example, 1 to 6.5 parts by weight, for example, 1 to 6 parts by weight, for example, 1 to 5.5 parts by weight, for example, 1 to 5 parts by weight, for example, 1.5 to 5 parts by weight, for example, 2 to 5 parts by weight, for example, 2.5 to 5 parts by weight per the particles 100 parts by weight, but is not limited thereto. When the compound having the N-aryl amino group is included in the above range, characteristics of crack resistance and transparency of the thermosetting resin composition may be further improved.

The particles including the compound having the N-aryl amino group on the surface may be included in an amount of 1 part by weight to 100 parts by weight, for example 1 part by weight to 60 parts by weight, for example 3 parts by weight to 60 parts by weight, for example 5 parts by weight to 60 parts by weight, for example 5 parts by weight to 50 parts by weight, for example 10 parts by weight to 50 parts by weight per 100 parts by weight of the silicone-based polymer. When the particles including the compound having the N-aryl amino group on the surface satisfy the above range, compatibility between the particles including the compound having the N-aryl amino group on the surface and silicone-based polymer may be increased, and characteristics of crack resistance and transparency of the curable resin composition may be further improved.

As (C) the solvent, any solvent that is usable at a process temperature of greater than or equal to 200° C. may be used. For example, the solvent may be an alcohol-type solvent, for example, butanol, isopropanol, and the like, a ketone-type solvent, for example, PMEA, DIBK, etc., in addition to these, any solvent known in the art and usable above a process temperature may be used alone or in combination of two or more.

When the solvent is used in a mixture of two or more, it may be a mixture of propylene glycol methyl ether acetate (PGMEA), gamma-butyrolactone (GBL), and other solvents, which may be usable at a process temperature of 100° C. to 230° C.

In an embodiment, the solvent may be included in an amount of 100 to 2,000 parts by weight, for example, 100 to 1,000 parts by weight, for example, 100 to 500 parts by weight, for example, 100 to 400 parts by weight, for example, 100 to 300 parts by weight based on 100 parts by weight of the silicone-based polymer, for example, the siloxane polymer, but is not limited thereto.

The curable resin composition may further include a curing catalyst for accelerating curing of an unreacted silanol group or an epoxy group at the siloxane resin terminal end of the silicone-based polymer, for example, the siloxane polymer, and the curing catalyst may be a thermal curing catalyst or a photocurable catalyst. Also, depending on the used polymer, this curing catalyst may not be included. In an embodiment, an example of a curing catalyst for curing a silicone-based polymer may include having an ammonium salt form such as tetrabutylammonium acetate (TBAA).

When using the curing catalyst, such a catalyst may be included in an amount of 0.1 to 1 part by weight, for example, 0.3 to 1 part by weight, for example, 0.5 to 1 part by weight, for example, 0.7 to 1 part by weight, for example, 0.8 to 1 part by weight based on 100 parts by weight of the silicone-based polymer, but is not limited thereto.

The curable resin composition may further include other additives.

As the other additive, a surfactant, for example, a fluorine-based surfactant may be further included, but is not limited thereto.

In the case that the composition includes the surfactant and the composition is used as a composition for forming a low refractive layer, it is possible to implement an effect of improving coating properties and preventing defects when coating on a substrate.

The additive may be included in an amount of less than or equal to 5 parts by weight, for example, 0.1 to 5 parts by weight, for example, 1 to 5 parts by weight, for example, 2 to 5 parts by weight, for example 3 to 5 parts by weight based on 100 parts by weight of the silicone-based polymer, but is not limited thereto.

Another embodiment may provide a cured film obtained by curing the curable resin composition.

Another embodiment may provide a device including the cured film.

[Mode for Invention]

Hereinafter, the present invention is illustrated in more detail with reference to examples. However, the following examples are only preferred embodiments of the present invention, and the present invention is not limited by the following examples.

EXAMPLES

Synthesis Example 1

Preparation of Siloxane Polymer (A-1)

77.15 g of methyltrimethoxy silane (MTMS), 50.57 g of tetraethoxy orthosilicate (TEOS), and 215.56 g of PGMEA were added to a 500 ml three-necked flask, and while stirring at room temperature, an aqueous hydrochloric acid solution in which 0.09 g of hydrochloric acid (36% aqueous solution) was dissolved in 45.43 g of water was added over 10 minutes. Subsequently, the flask was dipped in an oil bath at 60° C. and stirred for 250 minutes, and a molecular weight was adjusted by evaporating methanol, ethanol, aqueous hydrochloric acid solution, and water as reaction by-products for 180 minutes using a vacuum pump and Dean stark to obtain a siloxane polymer solution (A-1).

The obtained siloxane polymer solution (A-1) had a solid content concentration of 20.51 wt %, and the obtained siloxane polymer (A-1) had a weight average molecular weight, reduced to polystyrene, of 2,600 g/mol.

Synthesis Example 2

Preparation of Siloxane Polymer (A-2)

58.67 g of methyltrimethoxy silane (MTMS), 37.31 g of tetraethoxy orthosilicate (TEOS), 36.59 g of n-phenylaminopropyltriethoxysilane, and 221.94 g of PGMEA were added to a 500 ml three-necked flask, and while stirring at room temperature, an aqueous hydrochloric acid solution in which 0.03 g of hydrochloric acid (36% aqueous solution) was dissolved in 38.71 g of water was added over 10 minutes. Subsequently, the flask was dipped in an oil bath at 60° C. and stirred for 260 minutes, and a molecular weight was adjusted by evaporating methanol, ethanol, aqueous hydrochloric acid solution, and water as reaction by-products for 180 minutes using a vacuum pump and Dean stark to obtain a siloxane polymer solution (A-2).

The obtained siloxane polymer solution (A-2) had a solid content concentration of 20.16 wt %, and the obtained siloxane polymer (A-2) had a weight average molecular weight, reduced to polystyrene, of 2,540 g/mol.

Synthesis Example 3

Preparation of Siloxane Polymer (A-3)

43.59 g of methyltrimethoxy silane (MTMS), 26.67 g of tetraethoxy orthosilicate (TEOS), 24.52 g of n-phenylaminopropyltriethoxysilane, 34.04 g of 1,2-bistriethoxysilylethene and 224.14 g of PGMEA were added, while stirring at room temperature, an aqueous hydrochloric acid solution in which 0.03 g of hydrochloric acid (36% aqueous solution) was dissolved in 34.58 g of water was added over 10 minutes. Subsequently, the flask was dipped in an oil bath at 60° C. and stirred for 200 minutes, and a molecular weight was adjusted by evaporating methanol, ethanol, aqueous hydrochloric acid solution, and water as reaction by-products for 180 minutes using a vacuum pump and Dean stark to obtain a siloxane polymer solution (A-3).

The obtained siloxane polymer solution (A-3) had a solid content concentration of 22.10 wt %, and the obtained siloxane polymer (A-3) had a weight average molecular weight, reduced to polystyrene, of 2,800 g/mol.

Comparative Synthesis Example 1

Acryl-Based Polymer (A-4)

A benzyl methacrylate/methacrylic acid/glycidyl methacrylate terpolymer having a weight average molecular weight (Mw) of 15,800 g/mol and an acid value of 77 KOHmg/g (RY-35-1, SHOWA DENCO) was used.

Preparation of Curable Resin Composition

The specifications of the components used for preparing the curable resin compositions are as follows.

(A) Polymer
   (A-1) The siloxane polymer prepared in Synthesis Example 1
   (A-2) The siloxane polymer prepared in Synthesis Example 2
   (A-3) The siloxane polymer prepared in Synthesis Example 3
   (A-4) Acryl-based polymer (B) Particles
   (B-1) Hollow particle dispersion surface-treated with n-phenylaminopropyltrimethoxysilane (solid content: 20%, hollow particle average diameter: 85 nm; L2013, Nano New Materials Co., Ltd.)
   (B-2) Hollow particle dispersion surface-treated with methacryloxypropyltrimethoxysilane (solid content: 20%, hollow particle average diameter: 85 nm; L0516, Nano New Materials Co., Ltd.)

(C) Solvent
   Propylene glycolmonomethyl ether acetate (PGMEA)

(D) Other Additives
   Surfactant (F-563, DIC)

Example 1 to Example 9, and Comparative Example 1 and Comparative Example 2

Preparation of Curable Resin Composition

According to the compositions of Table 1, the siloxane polymers, the surface-treated particles, the solvents, and other additives were respectively mixed and stirred for about 30 minutes to prepare each curable resin composition.

TABLE 1

| | | Example 1 | Example 2 | Example 3 | Example 4 | Example 5 | Example 6 | Example 7 | Example 8 | Example 9 | Comparative Example 1 | Comparative Example 2 |
|---|---|---|---|---|---|---|---|---|---|---|---|---|
| Polymer | (A-1) | 32 | 30 | 29 | | | | | | | 32 | |
| | (A-2) | | | | 32 | 30 | 29 | | | | | |
| | (A-3) | | | | | | | 32 | 30 | 29 | | |
| | (A-4) | | | | | | | | | | | 32 |
| Particle (dispersion) | (B-1) | 25 | 27 | 29 | 25 | 27 | 29 | 25 | 27 | 29 | | 25 |
| | (B-2) | | | | | | | | | | 25 | |
| Solvent | | 42 | 42 | 41 | 42 | 42 | 41 | 42 | 42 | 41 | 42 | 42 |
| Additive | | 1 | 1 | 1 | 1 | 1 | 1 | 1 | 1 | 1 | 1 | 1 |

(unit: g)

Production and Evaluation of Cured Films (1) Evaluation of Refractive Index

The curable resin compositions prepared in Examples 1 to 9 and Comparative Examples 1 and 2 were spin-coated at 500 rpm for 20 seconds using a spin coater MS-A100 (manufactured by Mikasa) on a silicon wafer, followed by baking using a hot-plate for 2 minutes at 100° C. and 20 minutes at 230° C. to produce each 1.0 μm-thick coating cured film.

The refractive indices of the cured films were measured using an ellipsometer Base-160 (J.A.woollam Co.) at a wavelength of 370 nm to 1,000 nm, and the results at 550 nm are shown in Table 2.

(2) Evaluation of Crack Resistance

The curable resin compositions prepared in Examples 1 to 9 and Comparative Examples 1 and 2 were spin-coated at 100 to 150 rpm for 5 seconds on a glass substrate using a spin coater MS-A100 (manufactured by Mikasa), followed by baking using a hot-plate for 2 minutes at 100° C. and 20 minutes at 230° C. to produce each 5.0 μm-thick coating cured film.

The thicknesses of the step differences of the cured films were measured using Tencor (KLA P-6). If cracking did not occur, each portion of the coatings film was peeled off with a razor and then the thicknesses of the step differences were measured again using Tencor. The results are shown in Table 2.

(3) Evaluation of Haze

The curable resin compositions prepared in Examples 1 to 9 and Comparative Examples 1 and 2 were spin-coated at 200 rpm for 5 seconds using a spin coater MS-A100 (manufactured by Mikasa) on a glass substrate, followed by baking using a hot-plate for 2 minutes at 100° C. and 20 minutes at 230° C. to produce each 4.0 μm-thick coating cured film.

Degrees of cloudiness of the cured films were measured as haze values at a wavelength of 650 nm using a hazemeter for the cured films, and the results are shown in Table 2.

TABLE 2

| | Refractive index | Crack margin (μm) | Haze (%) at thickness of 4 μm |
|---|---|---|---|
| Example 1 | 1.231 | 4.8 | 0.39 |
| Example 2 | 1.230 | 4.7 | 0.46 |
| Example 3 | 1.221 | 4.5 | 0.67 |
| Example 4 | 1.229 | 6.0 | 0.19 |
| Example 5 | 1.226 | 5.7 | 0.22 |
| Example 6 | 1.218 | 5.8 | 0.24 |
| Example 7 | 1.226 | 4.4 | 0.20 |
| Example 8 | 1.223 | 4.3 | 0.20 |
| Example 9 | 1.216 | 4.1 | 0.26 |
| Comparative Example 1 | 1.229 | 3.5 | 0.49 |
| Comparative Example 2 | 1.314 | 1.9 | 0.48 |

Referring to Table 2, the cured films according to Examples 1 to 9 including the particles surface-treated with n-phenylaminopropyltrimethoxysilane exhibited improved crack resistance and haze properties, while maintaining low refractive indices, than the cured films according to Comparative Examples 1 and 2.

The cured film according to Comparative Example 2 that included particles surface-treated with n-phenylaminopropyltrimethoxysilane, but used then acrylic polymer as the polymer, crack resistance and haze characteristics were not improved compared with those of Examples 1 to 9.

Although the preferred embodiments of the present invention have been described in detail above, the present invention is not limited to the above embodiments, and may be manufactured in various different forms, and those skilled in the art to which the present invention pertains will be understood that it may be implemented in other specific forms without changing the idea or essential features. Therefore, the aforementioned embodiments should be understood to be exemplary but not limiting the present invention in any way.

The invention claimed is:

1. A curable resin composition comprising:
   (A) a silicone-based polymer comprising an N-aryl amino group;
   (B) particles including a compound having an N-aryl amino group on a surface thereof; and
   (C) a solvent,
   wherein the curable resin composition comprises 1 part by weight to 100 parts by weight of (B) the particles including the compound having the N-aryl amino group on the surface thereof based on 100 parts by weight of (A) the silicone-based polymer comprising the N-aryl amino group.

2. The curable resin composition of claim 1, wherein the silicone-based polymer is a siloxane polymer comprising an N-aryl amino group formed by hydrolyzing and condensing a compound represented by Chemical Formula 1:

$(R^1)_a(R^2)_b(R^3)_c-Si-(OR^4)_{4-a-b-c}$ [Chemical Formula 1]

wherein, in Chemical Formula 1,
$R^1$ to $R^3$ are each independently hydrogen; a substituted or unsubstituted C1 to C30 alkyl group; a substituted or unsubstituted C3 to C30 cycloalkyl group; a substituted or unsubstituted C6 to C30 aryl group; a substituted or unsubstituted C7 to C30 arylalkyl group; a substituted or unsubstituted C1 to C30 heteroalkyl group; a substituted or unsubstituted C2 to C30 heterocycloalkyl group; a substituted or unsubstituted C2 to C30 alkenyl group; a substituted or unsubstituted C2 to C30 alkynyl group; R(C=O)— in which R is a substituted or unsubstituted C1 to C30 alkyl group, a substituted or unsubstituted C3 to C30 cycloalkyl group, or a substituted or unsubstituted C6 to C30 aryl group; an epoxy group; a (meth)acrylate group; a (meth)acryloyloxy group; or a combination thereof,
$R^4$ is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, or a combination thereof, and
$0 \leq a+b+c < 4$.

3. The curable resin composition of claim 2, wherein the siloxane polymer comprising the N-aryl amino group is formed by hydrolyzing and condensing a monomer composition comprising the compound represented by Chemical Formula 1 and a compound represented by Chemical Formula 2:

[Chemical Formula 2]

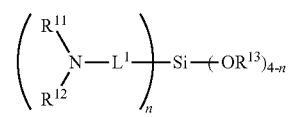

wherein, in Chemical Formula 2,

L$^1$ is a single bond, a substituted or unsubstituted C1 to C10 alkylene group, a substituted or unsubstituted C3 to C10 cycloalkylene group, a substituted or unsubstituted C6 to C30 arylene group, or a combination thereof, R$^{11}$ and R$^{12}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, or a combination thereof, provided that at least one of R$^{11}$ or R$^{12}$ is a substituted or unsubstituted C6 to C30 aryl group, R$^{13}$ is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, or a combination thereof, and 0<n<4.

4. The curable resin composition of claim 3, wherein the siloxane polymer comprising the N-aryl amino group comprises 50 to 85 mol % of units derived from the compound represented by Chemical Formula 1 and 15 to 50 mol % of units derived from the compound represented by Chemical Formula 2, based on 100 mol % of the siloxane polymer comprising the N-aryl amino group.

5. The curable resin composition of claim 3, wherein at least one of R$^{11}$ or R$^{12}$ of Chemical Formula 2 is a phenyl group.

6. The curable resin composition of claim 3, wherein in Chemical Formula 2, L$^1$ is a substituted or unsubstituted C1 to C5 alkylene group, one of R$^{11}$ or R$^{12}$ is a phenyl group and an other one of R$^{11}$ or R$^{12}$ is hydrogen, R$^{13}$ is a substituted or unsubstituted C1 to C5 alkyl group, and n is 1.

7. The curable resin composition of claim 3, wherein the monomer composition further comprises a compound represented by Chemical Formula 3:

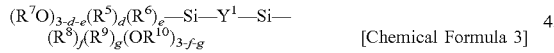

[Chemical Formula 3]

wherein, in Chemical Formula 3,

R$^5$, R$^6$, R$^8$, and R$^9$ are each independently hydrogen; a substituted or unsubstituted C1 to C30 alkyl group; a substituted or unsubstituted C3 to C30 cycloalkyl group; a substituted or unsubstituted C6 to C30 aryl group; a substituted or unsubstituted C7 to C30 arylalkyl group; a substituted or unsubstituted C1 to C30 heteroalkyl group; a substituted or unsubstituted C2 to C30 heterocycloalkyl group; a substituted or unsubstituted C2 to C30 alkenyl group; a substituted or unsubstituted C2 to C30 alkynyl group; R(C=O)— in which R is a substituted or unsubstituted C1 to C30 alkyl group, a substituted or unsubstituted C3 to C30 cycloalkyl group, or a substituted or unsubstituted C6 to C30 aryl group; an epoxy group; a (meth)acrylate group; a C1 to C30 alkyl group substituted with a (meth)acrylate group; a (meth)acryloyloxy group; or a combination thereof, R$^7$ and R$^{10}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, or a combination thereof, Y$^1$ is a substituted or unsubstituted C1 to C30 alkylene group, a substituted or unsubstituted C3 to C30 cycloalkylene group, a substituted or unsubstituted C6 to C30 arylene group, or a combination thereof, wherein the substituted or unsubstituted C6 to C30 arylene group is composed of a single aromatic ring, or includes 2 or more aromatic rings that are linked to each other by a single bond, —O—, —S—, —CO—, —COO—, —CONH—, a substituted or unsubstituted C1 to C30 alkylene group, a substituted or unsubstituted C3 to C30 cycloalkylene group, or a combination thereof, 0≤d+e<3, and 0≤f+g<3.

8. The curable resin composition of claim 7, wherein the siloxane polymer comprising the N-aryl amino group comprises 5 mol % to 30 mol % of units derived from the compound represented by Chemical Formula 3 based on 100 mol % of the siloxane polymer comprising the N-aryl amino group.

9. The curable resin composition of claim 1, wherein the silicone-based polymer has a weight average molecular weight, reduced to polystyrene, of 1,000 to 50,000 g/mol.

10. The curable resin composition of claim 1, wherein the compound having the N-aryl amino group included on the surface of the particles is a compound represented by Chemical Formula 2:

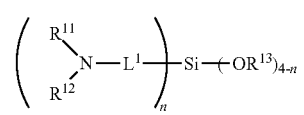

[Chemical Formula 2]

wherein, in Chemical Formula 2,

L$^1$ is a single bond or a substituted or unsubstituted C1 to C10 alkylene group, R$^{11}$ and R$^{12}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, or a combination thereof, R$^{13}$ is hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, or a combination thereof, at least one of R$^{11}$ or R$^{12}$ is a substituted or unsubstituted C6 to C30 aryl group, and 0<n<4.

11. The curable resin composition of claim 10, wherein at least one of R$^{11}$ or R$^{12}$ of Chemical Formula 2 is a phenyl group.

12. The curable resin composition of claim 10, wherein in Chemical Formula 2, L$^1$ is a substituted or unsubstituted C1 to C5 alkylene group, one of R$^{11}$ or R$^{12}$ is a phenyl group and an other one of R$^{11}$ or R$^{12}$ is hydrogen, R$^{13}$ is a substituted or unsubstituted C1 to C5 alkyl group, and n is 1.

13. The curable resin composition of claim 1, wherein the particles have a hollow structure.

14. The curable resin composition of claim 1, wherein the particles are particulates of a metal oxide including titanium oxide, silicon oxide, barium oxide, zinc oxide, zirconium oxide, or a combination thereof.

15. The curable resin composition of claim 1, wherein the particles are hollow silica.

16. The curable resin composition of claim 1, wherein the particles have an average diameter ($D_{50}$) of 10 nm to 150 nm.

17. The curable resin composition of claim 1, wherein the compound having the N-aryl amino group is included in an amount of 1 to 10 parts by weight per 100 parts by weight of the particles.

18. The curable resin composition of claim 1, wherein the curable resin composition comprises:
   10 parts by weight to 100 parts by weight of (B) the particles including the compound having the N-aryl amino group on the surface thereof, and
   100 parts by weight to 2,000 parts by weight of (C) the solvent,
   based on 100 parts by weight of (A) the silicone-based polymer comprising the N-aryl amino group.

19. A cured film obtained by curing the curable resin composition of claim 1.

20. A device comprising the cured film of claim 19.

* * * * *